US007307887B2

(12) United States Patent
Chen

(10) Patent No.: US 7,307,887 B2
(45) Date of Patent: Dec. 11, 2007

(54) CONTINUED VERIFICATION IN NON-VOLATILE MEMORY WRITE OPERATIONS

(75) Inventor: Jian Chen, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 28 days.

(21) Appl. No.: 11/322,011

(22) Filed: Dec. 29, 2005

(65) Prior Publication Data

US 2007/0153594 A1    Jul. 5, 2007

(51) Int. Cl.
*G11C 16/06* (2006.01)

(52) U.S. Cl. .......................... 365/185.22; 365/185.17; 365/185.09; 360/53; 369/30.21

(58) Field of Classification Search ............ 365/185.22, 365/185.17, 185.09; 360/53; 369/30.21
See application file for complete search history.

(56) References Cited

U.S. PATENT DOCUMENTS

| 5,172,338 | A |   | 12/1992 | Mehrotra et al. | |
|---|---|---|---|---|---|
| 5,570,315 | A | * | 10/1996 | Tanaka et al. | 365/185.22 |
| 5,602,987 | A |   | 2/1997 | Harari et al. | |
| 5,768,191 | A |   | 6/1998 | Choi et al. | |
| 5,774,397 | A | * | 6/1998 | Endoh et al. | 365/185.19 |
| 6,031,760 | A |   | 2/2000 | Sakui et al. | |
| 6,046,935 | A | * | 4/2000 | Takeuchi et al. | 365/185.03 |
| 6,456,528 | B1 | * | 9/2002 | Chen | 365/185.03 |
| 6,522,580 | B2 |   | 2/2003 | Chen et al. | |
| 6,560,143 | B2 |   | 5/2003 | Conley et al. | |
| 6,643,188 | B2 |   | 11/2003 | Tanaka et al. | |
| 6,657,891 | B1 | * | 12/2003 | Shibata et al. | 365/185.03 |

(Continued)

FOREIGN PATENT DOCUMENTS

JP    62-188100    8/1987

(Continued)

OTHER PUBLICATIONS

Torelli, et al., "An Improved Method for Programming a Word-Erasable EEPROM," Alta Frequenza, Nov.-Dec. 1983, vol. LII-N. 6.

(Continued)

*Primary Examiner*—Richard T. Elms
*Assistant Examiner*—Eric J. Wendler
(74) *Attorney, Agent, or Firm*—Vierra Magen Marcus & DeNiro LLP

(57) ABSTRACT

Temporary lock-out is provided while programming a group of non-volatile memory cells to more accurately program the memory cells. After successfully verifying that the threshold voltage of a memory cell has reached the level for its intended state, it is possible that the threshold voltage will subsequently decrease to below the verify level during additional iterations of the programming process needed to complete programming of other memory cells of the group. Memory cells are monitored (e.g., after each iteration) to determine if they fall below the verify level after previously verifying that the target threshold voltage has been reached. Cells that pass verification and then subsequently fail verification can be subjected to further programming. For example, the bit line voltage for the memory cell of interest may be set to a moderately high voltage to slow down or reduce the amount of programming accomplished by each subsequent programming pulse. In this manner, a memory cell that falls out of verification can be placed back in the normal programming flow without risking over-programming of the cell.

37 Claims, 10 Drawing Sheets

U.S. PATENT DOCUMENTS

| | | | |
|---|---|---|---|
| 6,807,104 B2 | 10/2004 | Arai et al. | |
| 6,839,281 B2 * | 1/2005 | Chen et al. | 365/185.21 |
| 6,888,758 B1 | 5/2005 | Hemink et al. | |
| 6,914,823 B2 | 7/2005 | Chen et al. | |
| 7,020,026 B2 * | 3/2006 | Guterman et al. | 365/185.28 |
| 7,057,939 B2 | 6/2006 | Li et al. | |
| 7,139,198 B2 | 11/2006 | Guterman et al. | |
| 2003/0002348 A1 * | 1/2003 | Chen et al. | 365/189.01 |
| 2003/0142546 A1 | 7/2003 | Yano | |
| 2003/0169623 A1 | 9/2003 | Yamada | |
| 2003/0174555 A1 | 9/2003 | Conley et al. | |
| 2004/0017722 A1 | 1/2004 | Cavaleri | |
| 2004/0047182 A1 | 3/2004 | Cernea et al. | |
| 2004/0057282 A1 | 3/2004 | Cernea | |
| 2006/0126394 A1 * | 6/2006 | Li | 365/185.22 |

FOREIGN PATENT DOCUMENTS

| | | |
|---|---|---|
| WO | 2005073981 | 8/2005 |
| WO | 2005101424 | 10/2005 |

OTHER PUBLICATIONS

Translation of Unexamined Japanese Patent Application No. 62-188100 (Application No. 61-31125), filed Feb. 13, 1986, "Writing Method for Ultraviolet-Erasable Programmable Rom," Applicant: Mitsubishi Denki K.K.

International Search Report & The Written Opinion of the International Searching Authority, Patent Cooperation Treaty, Application No. PCT/US2006/049220 entitled, "Continued Verification in Nonvolatile Memory Write Operations," May 29, 2007.

Notice of Allowance and Fee(s) Due, United States Patent & Trademark Office, U.S. Appl. No. 11/322,001 filed on Dec. 29, 2005, Aug. 8, 2007.

Allowed Claims, U.S. Appl. No. 11/322,001 filed Dec. 29, 2005.

* cited by examiner

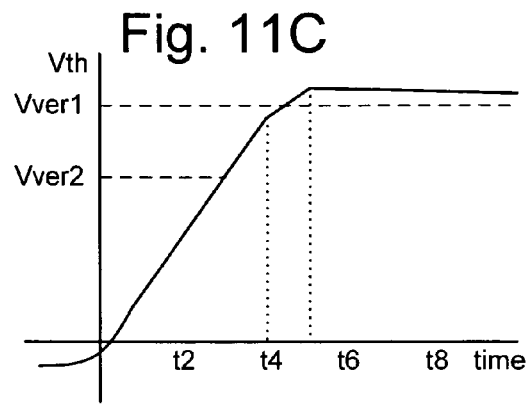
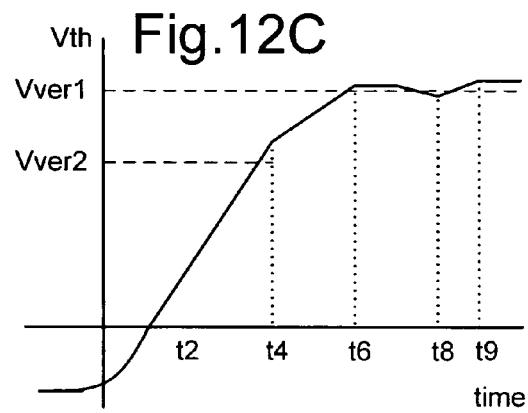
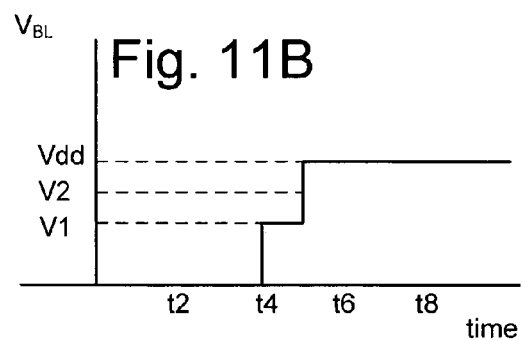
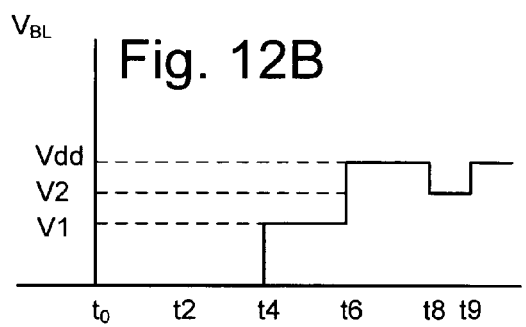
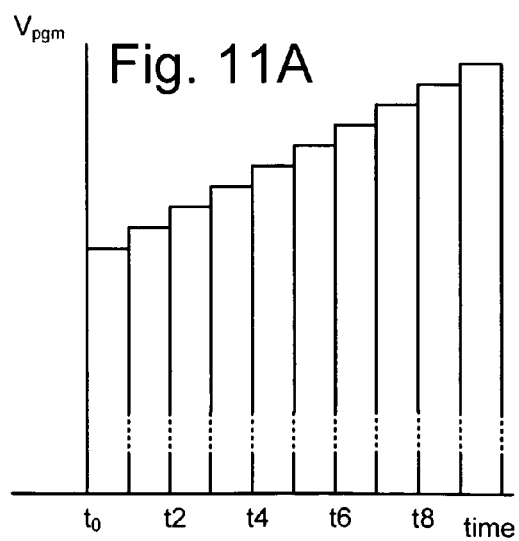
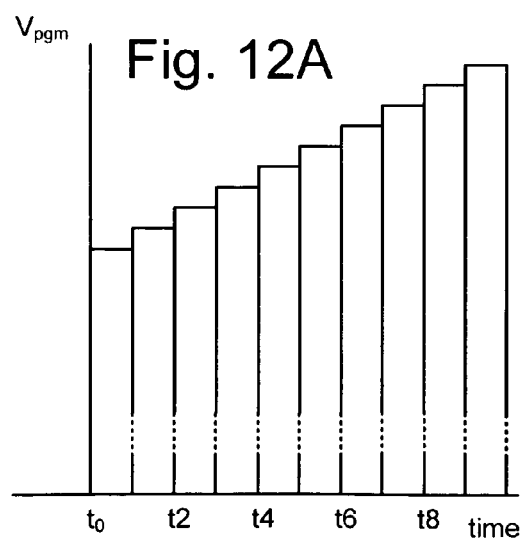

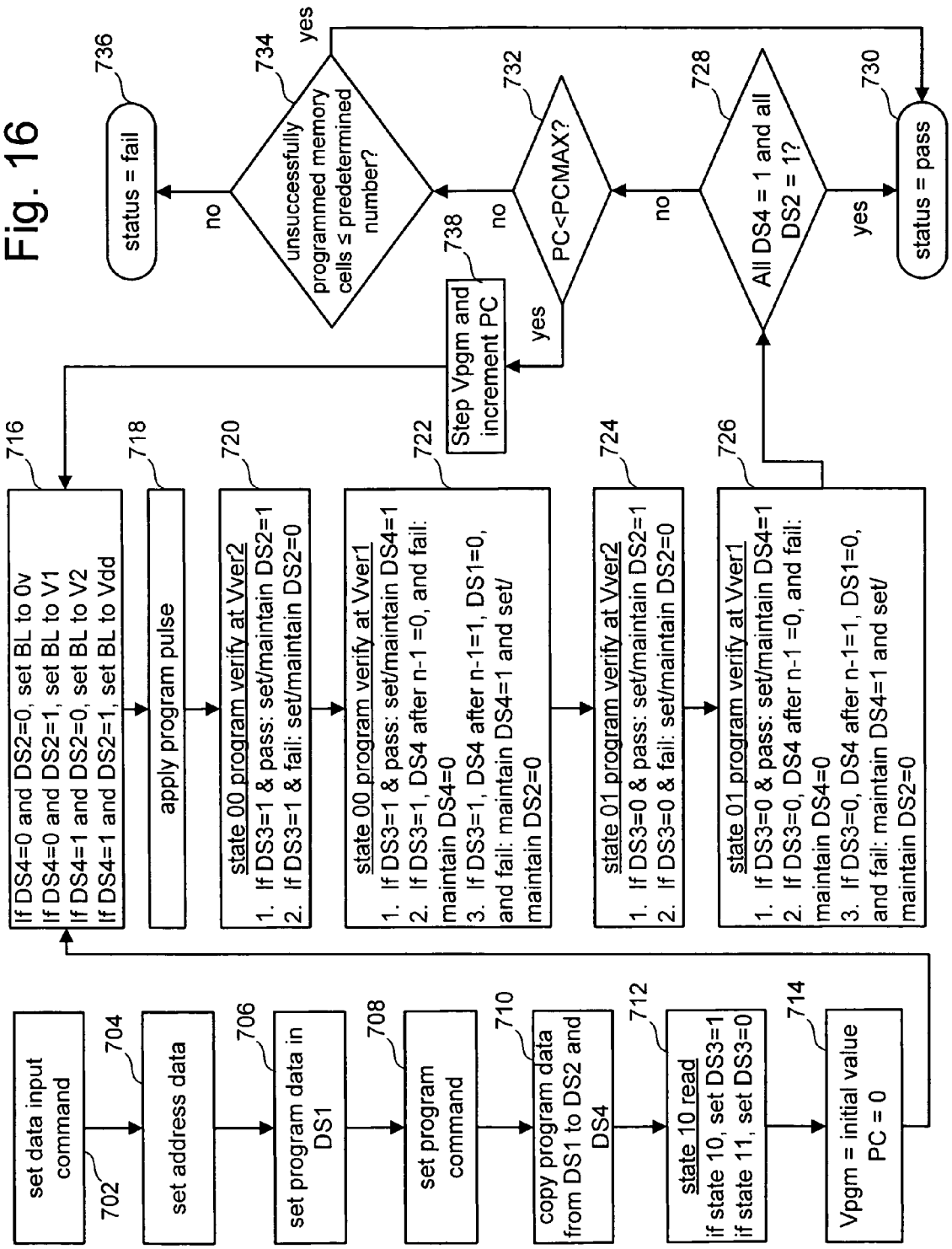

CONTINUED VERIFICATION IN NON-VOLATILE MEMORY WRITE OPERATIONS

CROSS-REFERENCE TO RELATED APPLICATIONS

The following applications are cross-referenced and incorporated by reference herein in their entirety:

U.S. patent application Ser. No. 11/322,001, entitled, "SYSTEMS FOR CONTINUED VERIFICATION IN NON-VOLATILE MEMORY WRITE OPERATIONS," by Jian Chen, filed concurrently.

BACKGROUND OF THE INVENTION

1. Field of the Invention

The present invention relates generally to semiconductor technology for programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1-3 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string. A typical architecture for a flash memory system using a NAND structure will include several NAND strings. For example, FIG. 4 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. patents/patent applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. patent application Ser. No. 09/893,277 (Publication No. US2003/0002348).

When programming a flash memory cell, a program voltage is applied to the control gate (via a selected word line) and the bit line is grounded. Electrons from the p-well are injected into the floating gate. When electrons accumulate in the floating gate, the floating gate becomes negatively charged and the threshold voltage of the cell is raised. When the threshold voltage of a memory cell reaches a target verify voltage for its intended state, the cell is locked-out from further programming since the appropriate amount of negative charge has been placed at its floating gate. The floating gate charge and threshold voltage of the cell can be indicative of a particular state corresponding to stored data.

Another type of memory cell utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

As device dimensions and the margins between adjacent threshold distributions continue to decrease to provide ever expanding memory capacity, errors and lack of precision in programming and reading back programmed data can become more problematic. For example, a slight shift in charge for a memory cell after completing programming can lead to erroneous readings of the data stored therein when the margins between states is minimal. As devices continue to be scaled, the occurrence of shifts in charge after programming may increase. Unintended changes to the charge stored in the floating gate of a particular memory cell can lead to erroneous readings or the need for error correction codes (ECC) in the memory system.

SUMMARY OF THE INVENTION

Technology described herein pertains to technology for programming non-volatile memory devices in a manner that provides for more reliable writing and better maintenance of a desired charge level in a cell of interest. In one embodiment, program verification is implemented in a continual fashion to re-verify previously verified memory cells and determine if they may have fallen below the appropriate program verify level corresponding to their target state. If they have, further programming of such cells can be instigated.

Temporary lock-out is provided while programming a group of non-volatile memory cells to more accurately program the memory cells. After successfully verifying that the threshold voltage of a memory cell has reached the level for its intended state, it is possible that the threshold voltage will subsequently decrease to below the verify level during additional iterations of the programming process needed to complete programming of other memory cells of the group. Memory cells are monitored (e.g., after each iteration) to determine if they fall below the verify level after previously verifying that the target threshold voltage had been reached. Cells that pass verification and then subsequently fail verification can be subjected to further programming. For example, the bit line voltage for the memory cell of interest may be set to a moderately high voltage to slow down or reduce the amount of programming accomplished by each subsequent programming pulse. In this manner, a memory cell that falls out of verification can be placed back in the normal programming flow without risking over-programming of the cell.

In one embodiment, a method of programming non-volatile memory is provided that includes programming a set of non-volatile storage elements. Each non-volatile storage element of the set is intended for programming to one of one or more target states. Programming is inhibited for each non-volatile storage element that reaches a respective verify level corresponding to the target state to which it is intended to be programmed. A first rate of programming is enabled for each non-volatile storage element that reaches a respective verify level corresponding to the target state to which it is intended to be programmed and that subsequently falls below the respective verify level corresponding to the target state to which it is intended to be programmed. A second rate of programming is enabled for each non-volatile storage element that has not yet reached a respective verify level corresponding to the target state to which it is intended to be programmed.

In one embodiment, a method of programming non-volatile memory is provided that includes programming a set of non-volatile storage elements. Each non-volatile storage element is intended for programming to one of one or more target states. The method includes applying a first voltage to a bit line of each non-volatile storage element that reaches a respective verify level corresponding to the target state to which it is intended to be programmed, applying a second voltage to a bit line of each non-volatile storage element that reaches a respective verify level corresponding to the target state to which it is intended to be programmed and is subsequently determined to no longer be at or above the respective verify level, and applying a third voltage to a bit line of each non-volatile storage element that has not yet reached a respective verify level corresponding to the target state to which it is intended to be programmed.

Other features, aspects, and objects of the invention can be obtained from a review of the specification, the figures, and the claims.

BRIEF DESCRIPTION OF THE DRAWINGS

FIGS. 11A-11C depict a programming process in accordance with one embodiment utilizing coarse/fine programming.

FIGS. 12A-12C depict a programming process in accordance with one embodiment that utilizes coarse/fine programming.

FIG. 16 is a flowchart describing a method for programming an upper page in accordance with one embodiment utilizing upper/lower page programming.

DETAILED DESCRIPTION

Figure 5:
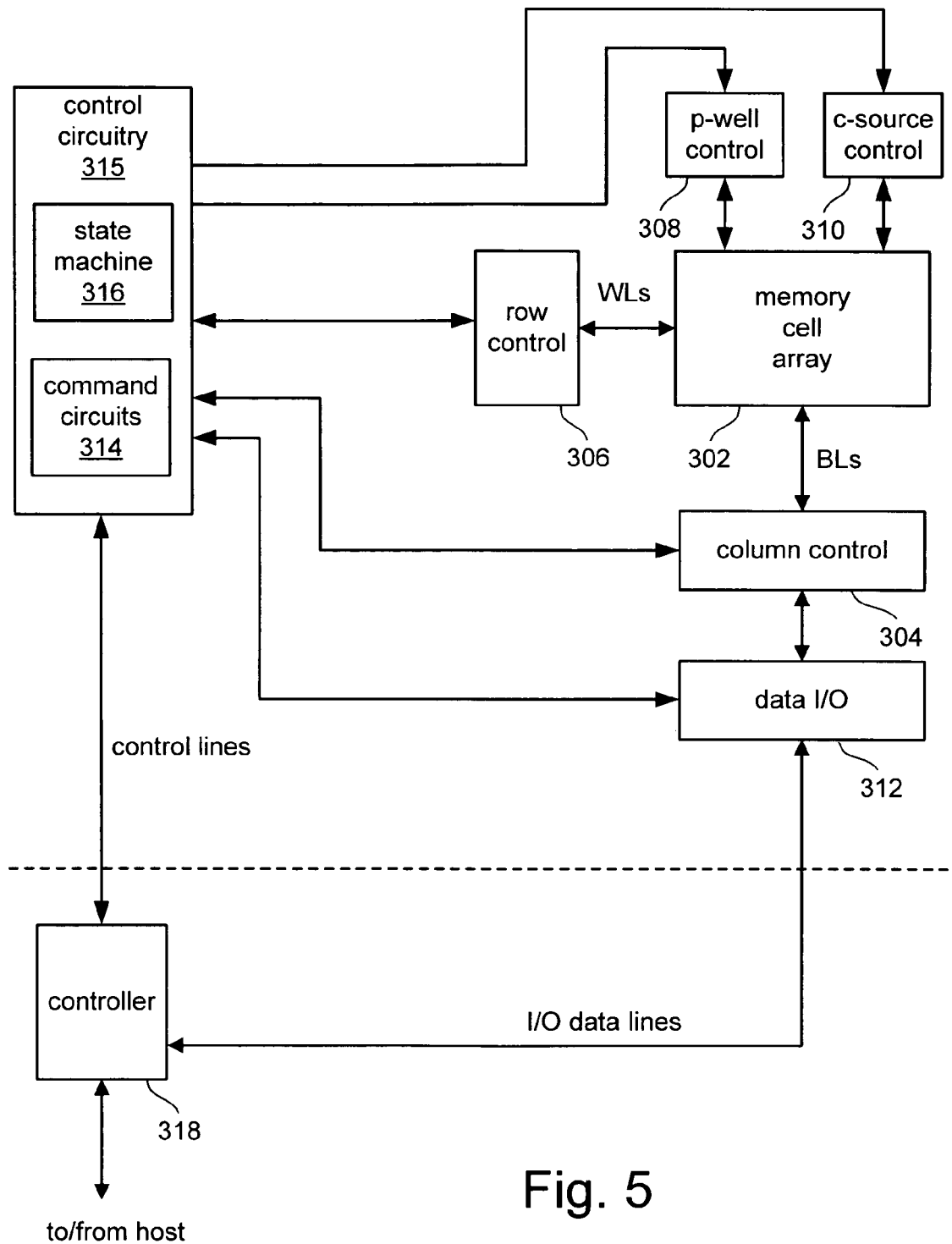
FIG. 5 is a block diagram of one embodiment of a non-volatile memory system in which the various aspects of the present invention can be implemented.

FIG. 5 is a block diagram of one embodiment of a flash memory system that can be used to implement one or more embodiments of the present disclosure. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 6:
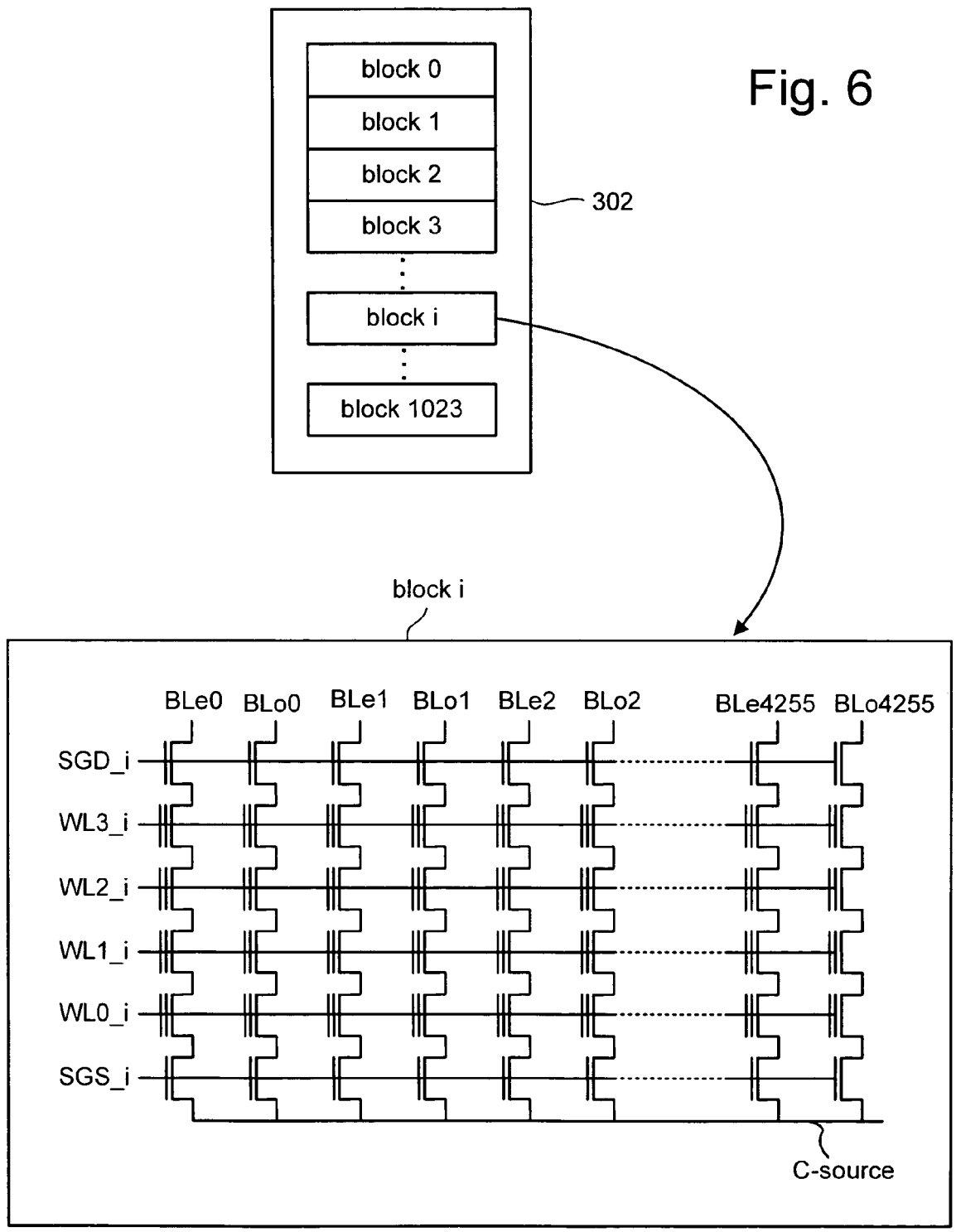
FIG. 6 illustrates an exemplary organization of a memory array.

With reference to FIG. 6, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 6 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. U.S. patent application Ser. No. 11/099,133, entitled "COMPENSATING FOR COUPLING DURING READ OPERATIONS OF NON-VOLATILE MEMORY," filed Apr. 5, 2005, incorporated by reference in its entirety, describes examples of full sequence and two-pass programming (described hereinafter) for both all bit line and odd/even bit line programming architectures.

During read and programming operations of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 5 and 6 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different, for example, having a starting level of higher or lower than 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 7:
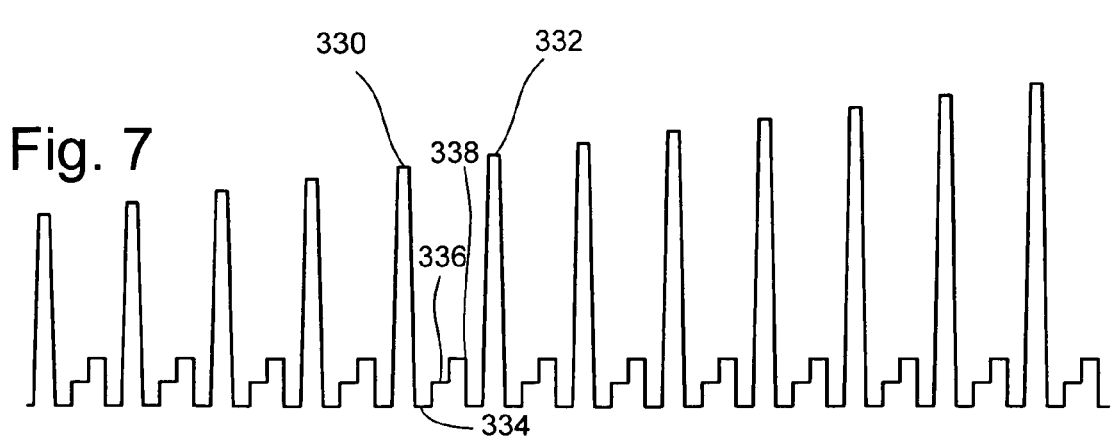
FIG. 7 depicts an exemplary program/verify voltage signal that can be applied to a selected word line in accordance with embodiments.

FIG. 7 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/260,658, entitled "Method for Programming of Multi-State Non-Volatile Memory Using Smart Verify, filed Oct. 27, 2005; and U.S. patent application Ser. No. 11/259,799, entitled "Apparatus for Programming of Multi-State Non- Volatile Memory Using Smart Verify," filed Oct. 27, 2005, all of which are incorporated herein by reference in their entirety.

The read and verify operations described above are performed according to techniques known in the art. Thus, many of the details explained can be varied by one skilled in the art.

Figure 8:
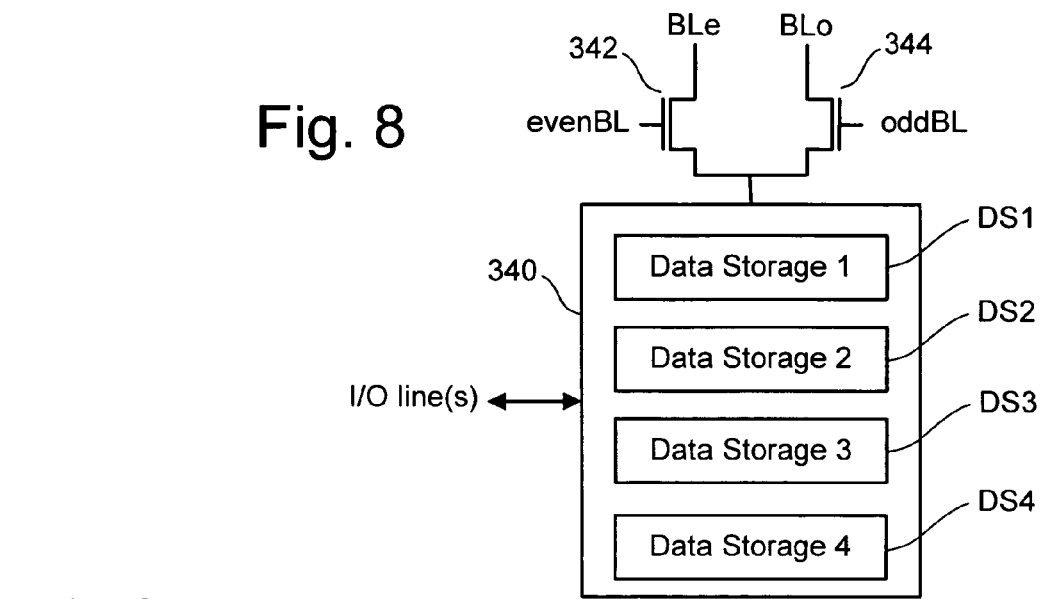
FIG. 8 depicts a portion of a column control circuit.

FIG. 8 is a schematic block diagram of a portion of column control circuit 304 of FIG. 5. In column control circuit 304, a data storage circuit 340 is arranged for every two bit lines, including an even numbered BLe and an odd numbered bit line BLo. In the column control circuit 304, a sense amplifier is also arranged for data storage circuit 340 in order to write data into and read data from memory cells.

An n-channel MOS transistor 342 is connected for column selection between data storage circuit 340 and even numbered bit line BLe. Another n-channel MOS transistor 344 is connected for column selection between data storage circuit 340 and odd numbered bit line BLo. Either of the even numbered bit line BLe or the odd numbered bit line BLo is selected to control the operation of writing data or reading data. More specifically, when signal evenBL is at logic level 1 and the signal oddBL is at logic level 0, and MOS transistor 342 is made electrically conductive to select the even numbered bit line BLe, which is then connected to the data storage circuit 340. When, on the other hand, the signal evenBL is at logic level 0 and oddBL is at logic level 1, transistor 344 is made electrically conductive to select the odd numbered bit line BLo, which is then connected to the data storage circuit 340. Note that the signal evenBL is applied to all of the n-channel MOS transistors for column selection connected through the even numbered bit lines; whereas the signal oddBL is applied to all the n-channel MOS transistors for column selection connected to the odd numbered bit lines.

Each data storage circuit 340 includes four binary data storage sections DS1, DS2, DS3, and DS4. Storage section DS1 is connected to the data input/output 312 by way of the internal data input/outlines line(s) and stores externally input data to be written or readout data to be externally output. Data storage section DS2 stores the detection outcome of a write verify operation for confirming the threshold value of a memory cell after a write operation. Data storage section DS3 temporarily stores the data of a memory cell at the time of writing it and/or at the time of reading it. DS4 stores a copy of the data initially loaded to circuit 340 for programming. In other embodiments, the data storage sections can also have other functions or can be configured in different ways. In various embodiments, DS1, DS2, DS3, and DS4 can be portions of a memory unit, one or more registers, or any other device that can store information. In one embodiment, DS1, DS2, DS3, and DS4 are each one bit. In other embodiments, one or more of DS1, DS2, DS3, and DS4 can store multiple bits. Circuits other than the circuit depicted in FIG. 8 can also be used to control bit lines.

Note that the FIG. 8 shows an even/odd bit line configuration. However, the present invention can be used with many different bit line configurations, such as a configuration where each bit line has its own sense amplifier and/or data storage. In some configurations suitable for implementing the present invention, all bit lines are programmed in one pass, rather than in odd and even passes. For example, see U.S. patent application Ser. No. 10/254,483, "Highly Compact Non-Volatile Memory and Method Thereof," filed on Sep. 24, 2002, incorporated herein by reference in its entirety.

Figure 9:
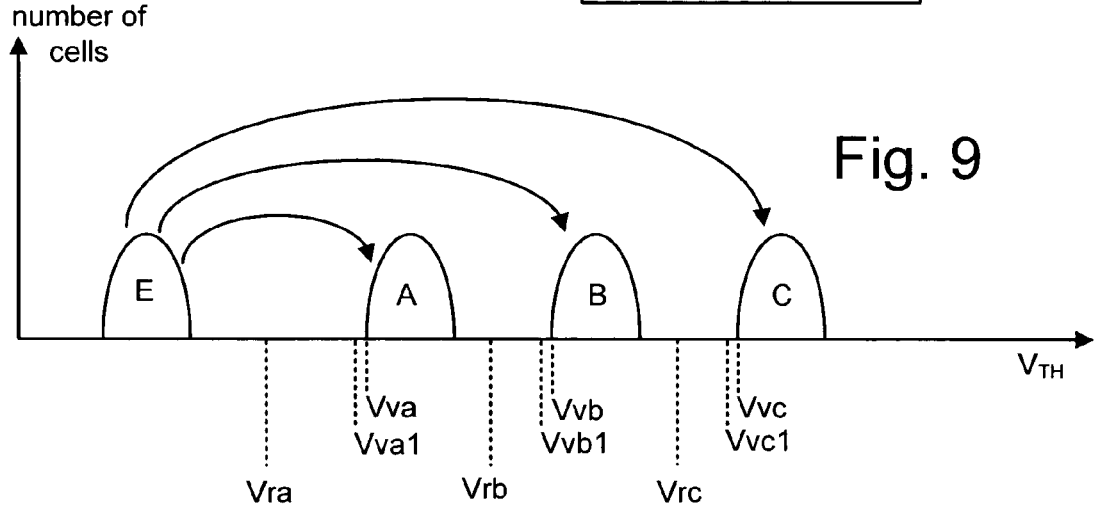
FIG. 9 depicts exemplary threshold voltage distributions for a set of multi-state non-volatile memory cells and a programming process for programming the set of cells.

At the end of a successful program process, the threshold voltages of the memory cells should be within one or more distributions of threshold voltages for programmed memory cells or within a distribution of threshold voltages for erased memory cells, as appropriate. FIG. 9 illustrates threshold voltage distributions for the memory cell array when each memory cell stores two bits of data. FIG. 9 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 9 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 9 shows four states, the present invention can also be used with other multi-state structures including those that include more or less than four states.

FIG. 9 shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 9 shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. The additional verify reference voltages Vva1, Vvb1, and Vvc1 will be described hereinafter for application during coarse/fine programming.

In one embodiment as depicted in FIG. 9, known as full sequence programming, memory cells can be programmed from the erase state E directly to any of the programmed states A, B or C. For example, a population of memory cells to be programmed may first be erased so that all memory cells in the population are in erased state E. The process depicted in FIG. 9, using the control gate voltage sequence depicted in FIG. 7, will then be used to program memory cells directly into states A, B or C. While some memory cells are being programmed from state E to state A, other memory cells are being programmed from state E to state B and/or from state E to state C. In such embodiments, both bits coded for a particular memory state of a memory cell can be regarded as part of a single page of data.

Figure 10:
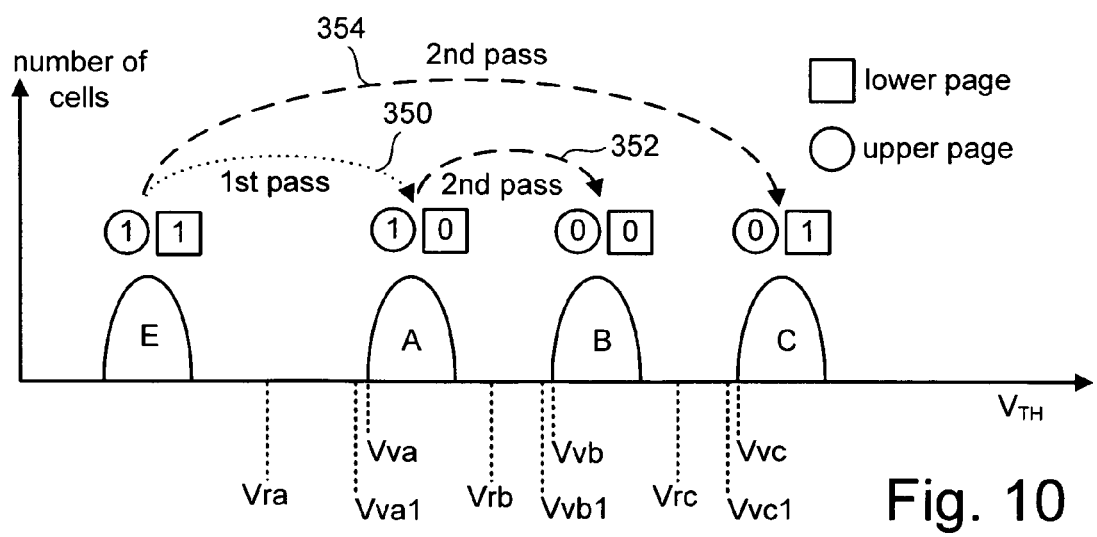
FIG. 10 depicts exemplary threshold voltage distributions for a set of multi-state non-volatile memory cells and a programming process for programming the set of cells.

FIG. 10 illustrates an example of a two-pass technique of programming a multi-state memory cell that stores data for two different pages: a lower page and an upper page. Four states are depicted: state E (11), state A (10), state B (O) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 350. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 354. If the cell had been programmed into state A as a result of the first programming pass, then the memory cell is further programmed in the second pass so that the threshold voltage is increased to be within state B, as depicted by arrow 352. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Other programming methods than those shown in FIGS. 9 and 10 can be used in accordance with embodiments. For example, U.S. Pat. No. 6,657,891, entitled "Semiconductor Memory Device for Storing Multivalued Data," by Shibata, et al., incorporated herein by reference in its entirety, describes an alternate method for programming that can be used. The technique described therein describes a programming method for non-volatile memory that reduces floating gate to floating gate coupling by, for any particular memory cell, writing to that particular memory cell with respect to a particular page subsequent to writing to adjacent memory cells for previous pages. The non-volatile memory cells can store two bits of data per memory cell in one embodiment using four data states. The erased state E can store data 11, first programmed state A store data 01, state B store data 10, and state C store data 00. Each memory cell stores data for two pages which can be referred to as an upper page and lower page as in FIG. 10. The method, including the use of an intermediate state, can lessen the effects of floating gate to floating gate coupling due to subsequently programmed neighboring cells.

In some implementations, a two-phase programming process is used to achieve tight threshold voltage distributions, without unreasonably slowing down the programming process. The first phase, a coarse programming phase, includes an attempt to raise a threshold voltage in a faster manner while paying less attention to achieving a tight threshold voltage distribution. The second phase, a fine programming phase, attempts to raise the threshold voltage in a slower manner in order to reach the target threshold voltage, thus achieving a tighter threshold voltage distribution. One example of a coarse/fine programming methodology can be found in U.S. Pat. No. 6,643,188, incorporated herein by reference in its entirety.

When programming memory cells to a target state, two verify levels are used. For example, a final verify level Vver1 which can correspond to Vva, Vvb, Vvc, etc. can be used. When the threshold voltage of a memory cell to be programmed to state A, for example, has reached final verify level Vva, the memory cell will be inhibited from further programming by applying an inhibit voltage to the bit line corresponding to that memory cell. For example, the bit line voltage can be raised to Vdd. However, when a memory cell has reached a threshold voltage close to (but lower than) the final target level Vva, the threshold voltage shift of the memory cell during subsequent programming pulses is slowed down by applying a certain bias voltage (e.g., V1) to the bit line. V1 can typically on the order of 0.3V to 0.8V. Because the rate of threshold voltage shift is reduced during the next few programming pulses, the final threshold voltage distribution can be narrower than with conventional methods. To implement this method, a second verify level that is lower then Vver1 is used. The second verify levels Vver2 are depicted in FIGS. 9 and 10 as Vva1, Vvb1, and Vvc1. When the threshold voltage of a memory cell to be programmed to state A is larger than Vva1, but still lower than Vva, the threshold voltage shift to the memory cell will be reduced for subsequent programming pulses by applying a bit line bias V1. Note that in this case, two verify operations are required for each state. One verify operation at the corresponding final verify level (e.g., Vva) for each state to which the coarse/fine programming methodology is applied, and one verify operation at the corresponding second verify level (e.g., Vva1) for each state. This may increase the total time needed to program the memory cells. However, a larger ΔVpgm step size can be used to speed up the process.

In order to maintain reasonable programming times, coarse/fine programming algorithms may not applied to the highest memory state (the state corresponding to the largest positive threshold voltage range) in some embodiments. The highest state, such as state C in FIG. 10, does not need to be differentiated from a higher state. Typically, it is only necessary to program cells for this state above a minimum threshold level to differentiate from the next lowest state (e.g., state B represented by distribution 12). Thus, the distribution of these cells can occupy a wider threshold voltage range without adverse effects on device performance.

Figure 1:
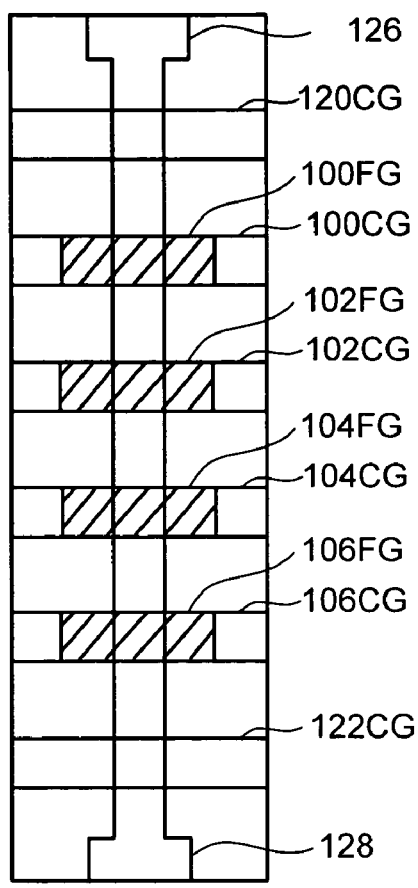
FIG. 1 is a top view of a NAND string.
Figure 2:
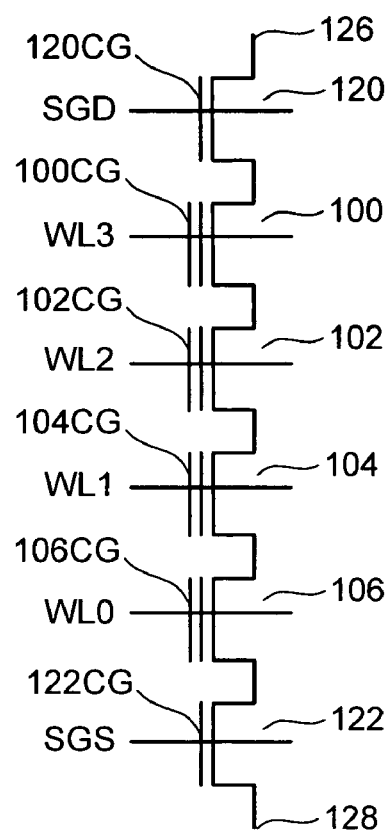
FIG. 2 is an equivalent circuit diagram of the NAND string depicted in FIG. 1.
Figure 3:
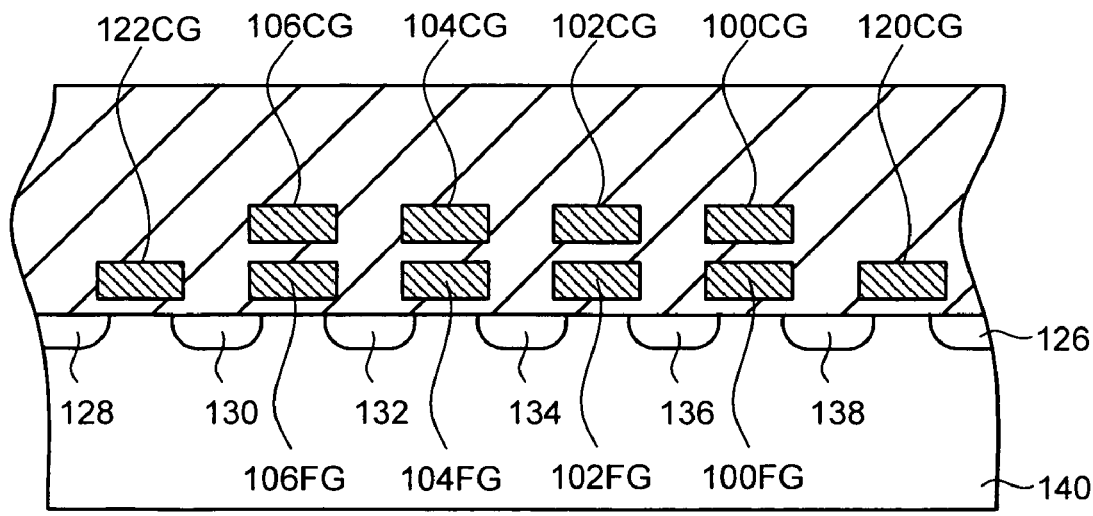
FIG. 3 is a cross sectional view of the NAND string of FIG. 1
Figure 4:
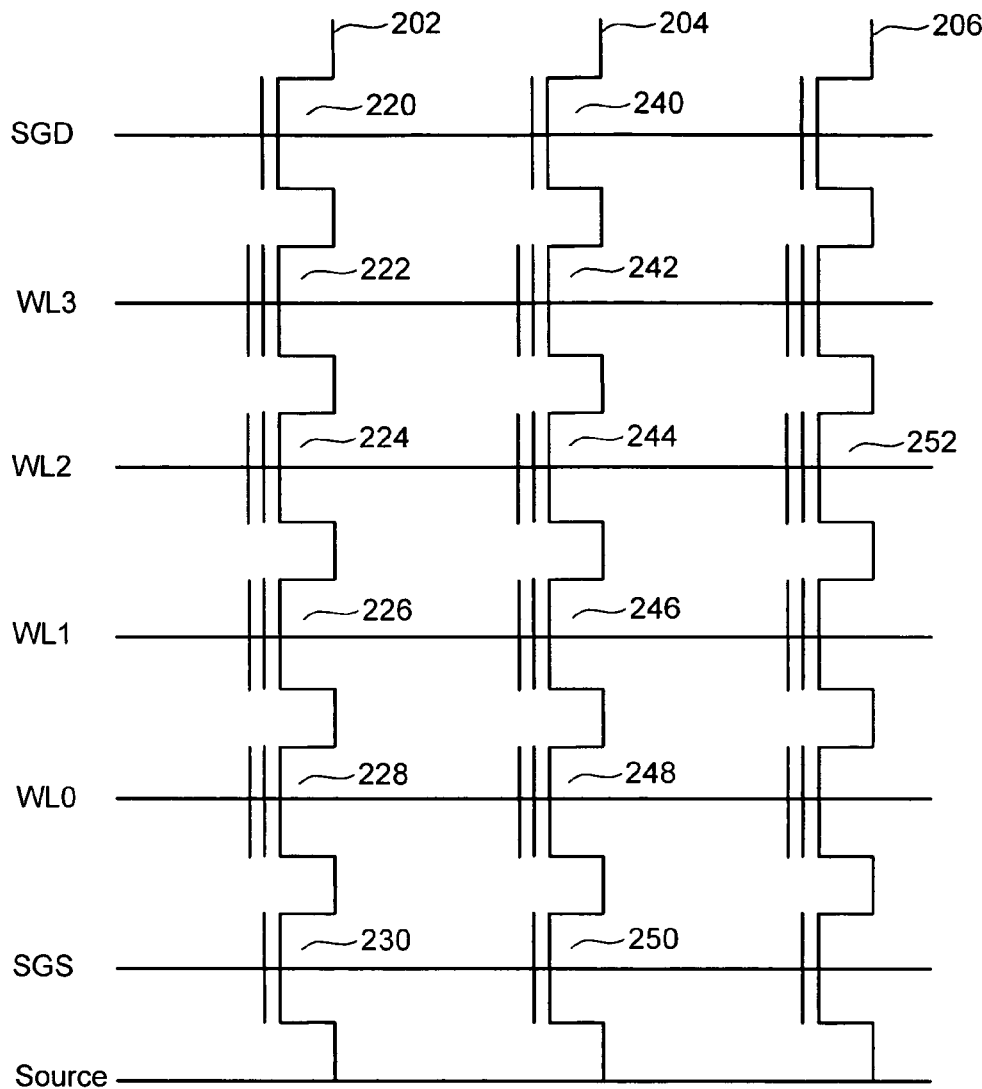
FIG. 4 is a circuit diagram depicting three NAND strings.

In some instances, memory cells that successfully verify for an intended state during a programming operation may subsequently fall out of the threshold voltage range (below the final verify level) for the intended state. This can cause read errors and/or requirements for compensation techniques such as the use of error correction codes (ECC). Cells are continually being scaled to provide more memory capacity. This scaling can include decreasing the thickness (actual or effective) of the dielectric (referred to as inter-gate or inter-poly dielectric) between the control gate and floating gate. Additionally, materials with higher dielectric constants (high-K) are being used which may be more prone to leakage than typical ONO dielectrics, for example. When a large potential exists between the control gate and floating gate of a memory cell, negative charge may be drawn out of the floating gate toward the control gate, resulting in an unintended threshold voltage change. With reference to FIGS. 2 and 3 for example, electrons may be drawn out of floating gate 106FG toward control gate 106CG, causing the threshold voltage of memory cell 106 to change. For example, when a cell is locked-out or inhibited from programming and the program voltage is applied to program other cells connected to the same word line as the locked-out cell, a large potential exists between the control and floating gate of the locked-out cell. Electrons may be leak from the floating gate and cause the threshold voltage of the locked-out cell to slip below the final verify level for its intended state. In FIG. 4 for example, memory cell 224 may be locked-out while programming of memory cell 244 continues by applying the program voltage to WL2. The large potential at the control gate of memory cell 224 may draw electrons out of the floating gate of memory cell 224.

In typical program operations, cells are permanently locked-out from further programming after passing a verify operation for the intended state. These cells do not undergo further verification after successfully verifying. Thus, these cells may have a threshold voltage below the verify level for their intended state at the end of programming even though they were successfully verified.

In accordance with one embodiment, memory cells are verified throughout programming in order to detect cells that may lose negative charge after verification. For example, memory cells can undergo verification after each programming pulse (program operation) whether or not they have already successfully verified for their target state. If a previously verified memory cell fails to verify in further iterations of the programming process, it can undergo additional programming.

FIGS. 11A-11C and 12A-12C depict a programming process in accordance with one embodiment. FIGS. 11A and 12A depict the programming pulses $V_{pgm}$ applied to the control gate. FIGS. 11B and 12B depict the bit line voltages for the memory cells being programmed. FIGS. 11C and 12C depict the threshold voltage of the memory cells being programmed. The process of FIGS. 11A-11C and 12A-12C is performed using coarse/fine programming. In other embodiment, coarse/fine programming is not used.

The memory cell depicted in FIGS. 11A-11C is determined to have reached the Vver2 level for its target state at time t4 after the application of four program voltage pulses of increasing magnitude. For example, Vver2 may correspond to Vva1, Vvb1, etc. The bit line voltage for the cell is raised to V1 at time t4 to slow the programming speed of the memory cell for the fine programming phase. At time t5, after one additional pulse, the cell is determined to have reached the Vver1 level for its target state. Accordingly, the bit line voltage is raised to Vdd to inhibit the cell from further programming. The memory cell continues to undergo verification until the entire programming process memory operation for the word line being programmed completes. FIG. 11C shows that the threshold voltage for the memory cell remains above the Vver1 level for the remainder of programming. Thus, the bit line voltage remains at Vdd to inhibit programming.

The memory cell depicted in FIGS. 12A-12C reaches the Vver2 level for its intended state at time t4 also. The bit line voltage is raised to V1 and two more pulses are applied before the threshold voltage reaches the Vver1 level at time t6. The bit line voltage is then raised to Vdd to inhibit programming. At time t7, the threshold voltage is still above Vver1 so the bit line voltage remains at Vdd. At time t8, however, the threshold voltage drops slightly below the Vver1 level. The control circuitry (e.g., a processor or column control circuitry 304) can detect this change and lower the bit line voltage to V2 at time t8 to enable further programming. At time t9, the threshold voltage is back above Vver1 and the bit line voltage is again raised to Vdd. The threshold voltage remains above Vver1 for the remainder of programming.

As FIGS. 12A-12C illustrate, a memory cell is more accurately programmed by only temporarily locking it out during the programming process. A subsequent drop in threshold voltage due to programming other memory cells is detected so that the already verified cell is further programmed. V2 can be a larger voltage than V1 in one embodiment to gradually and slowly program the cell back above the final verify level. In this manner, over-programming can be minimized or eliminated. The slowed programming (smaller shift in threshold voltage with each pulse) due to a raised bit line voltage may be referred to as reduced programming. If a low bit line voltage (e.g., 0V) is applied, the cell may be over-programmed. The program voltage may have been increased by the step size several times since its previous successful verification. If the cell is unlocked for full programming (BL=0V), the cell's threshold voltage may end up in a forbidden zone or threshold voltage range of an adjacent state. In other embodiments, however, V2 can be less than or equal to V1.

Figure 13:
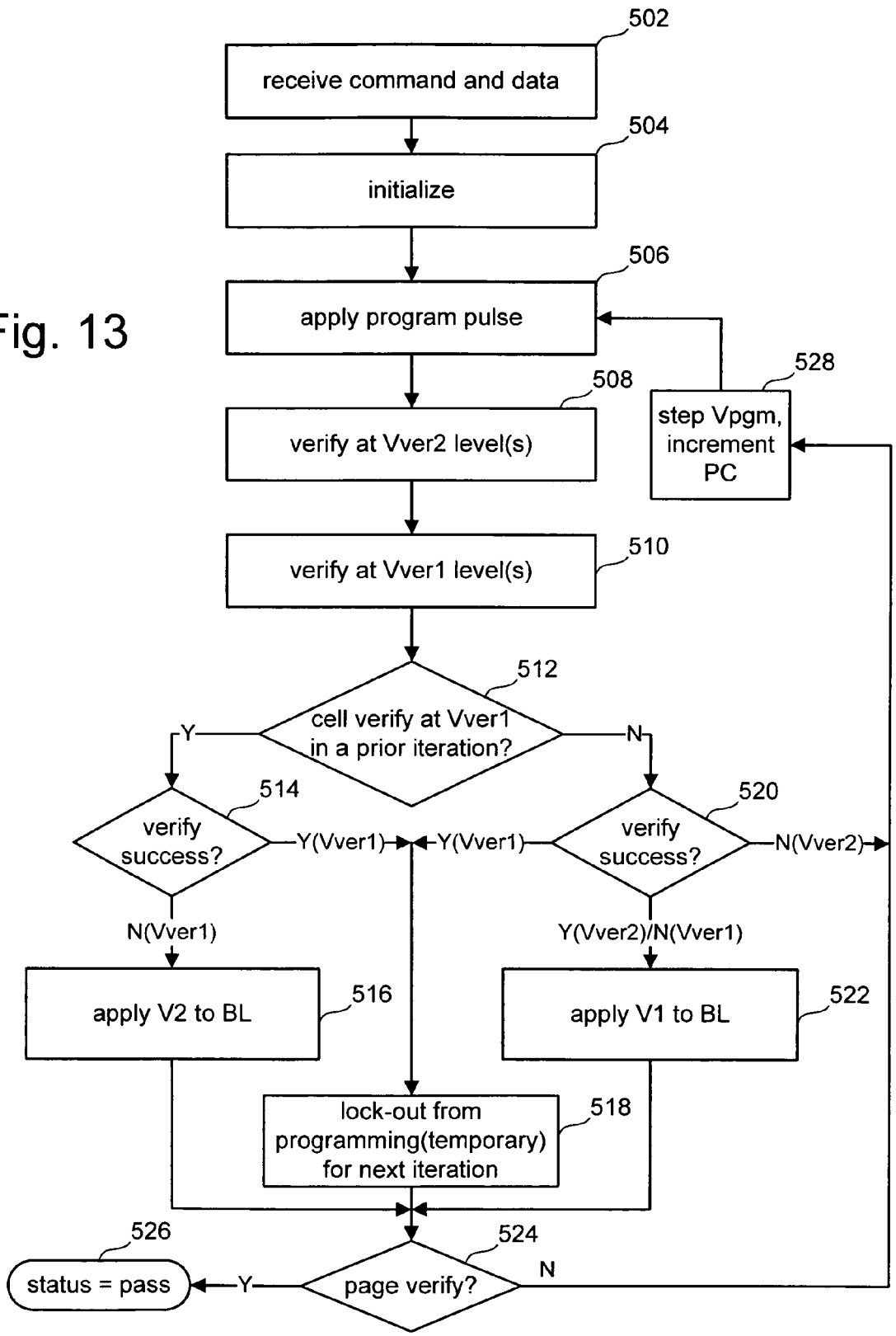
FIG. 13 is a flowchart describing a generalized method for programming in accordance with one embodiment.

FIG. 13 is a flowchart describing a general method for programming memory using concepts such as described with respect to FIGS. 11A-11C and 12A-12C. At step 502, the system (e.g., FIG. 4) receives commands and data to program the memory. At step 504, initialization is performed. In some embodiments, memory cells may be erased prior to programming. Soft programming may be performed so that the erased memory cells will each have a threshold voltage within a narrow erased threshold voltage distribution. Status registers may be initialized as well. At step 506, a programming pulse is applied. Each control gate of the memory cells connected to a particular word line will receive the pulse. At step 508, the cells are verified to determine whether their threshold voltage has reached the verify level Vver2 corresponding to their intended state. At step 510, the cells are verified to determine whether their threshold voltage has reached the verify level Vver1 corresponding to their intended state.

The process branches at step 512 based on whether the cell was successfully verified in a previous iteration (n−1, n−2, etc.) at the Vver1 level for its intended state. If the memory cell was not previously verified at the Vver1 level for its target state, the process branches to step 520 where the process branches based on the status of the two current (n) verify operations. If the cell failed to verify at Vver2 (step 508), the process advances to step 528 where the programming voltage is increased by a step size and the counter PC for the process incremented. A counter can be used to limit the number of iterations of a programming operation. For example, the counter value can be checked prior to step 528 to determine whether to continue, fail, or pass the operation.

If the memory cell verified at the verify level Vver1 (step 510), the process continues at step 518 where it is locked-out or inhibited from programming during the next programming iteration n+1. If the memory cell verified at the Vver2 level but not the Vver1 level, its bit line can be set to V1 at step 522 to slow down the increase in its threshold voltage during the next programming iteration. If the programming process for the page is successful as determined at step 524, a status of pass is reported at step 526. The process can be deemed successful when all or a predetermined number of cells reach the Vver1 for their intended states.

If the memory cell was successfully verified prior to the current iteration, the process branches from step 512 to step 514. If the cell again verifies at the verify level Vver1, its locked-out or inhibited status is maintained at step 518. If, however, the cell now fails to verify at the Vver1 level, it is subjected to further programming. At step 516, its bit line is set to V2 to enable programming during the next iteration. In one embodiment, V2 is less than V1 to enable an even smaller increase in threshold voltage with each program voltage pulse than the fine programming V1 provides. In other embodiments, different values can be used. In one embodiment, if the memory cell fails to verify at Vver2 after previously verifying at Vver1, V1 could be applied since the threshold voltage has dropped significantly. Over-programming should be avoided.

Figure 14:
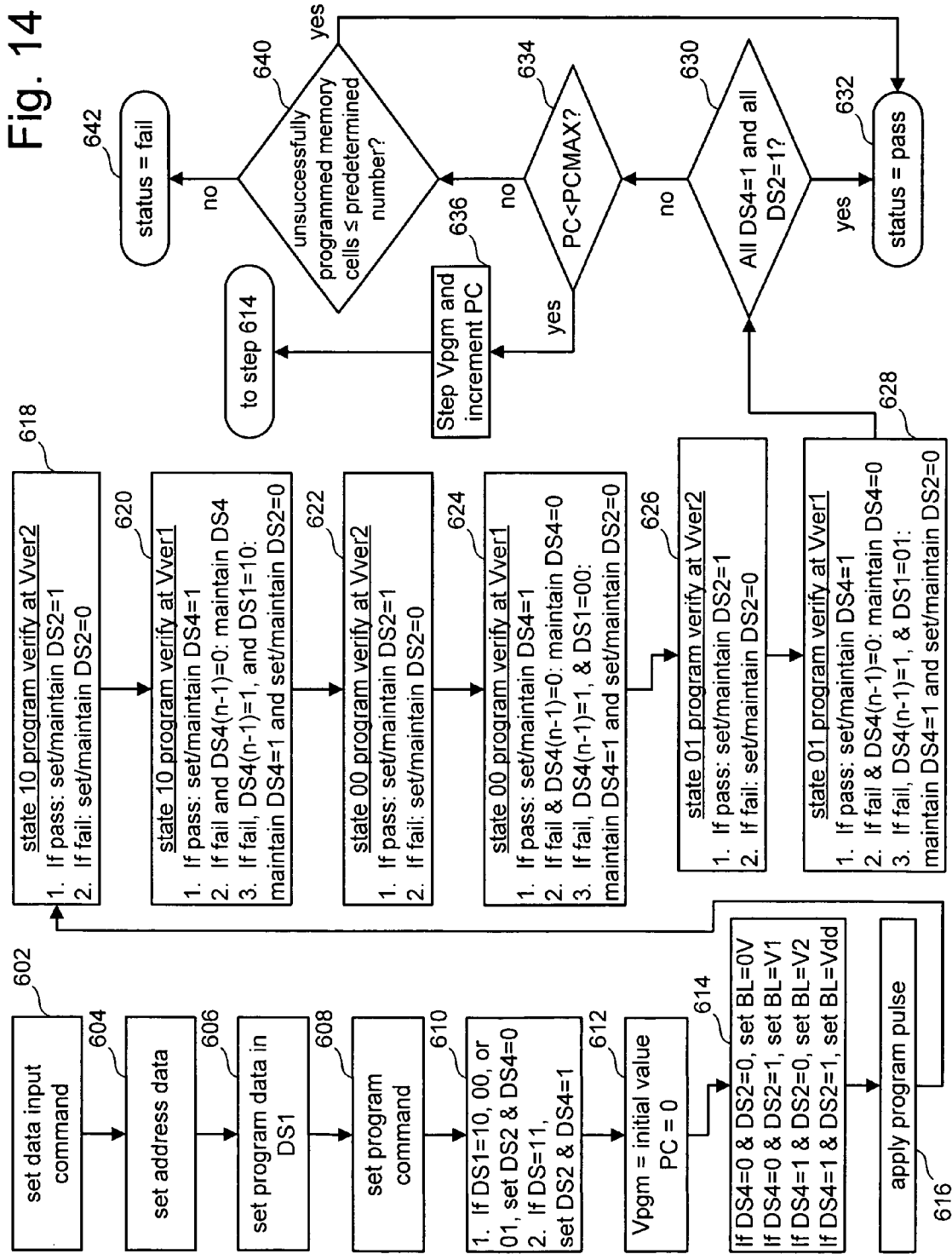
FIG. 14 is a flowchart describing a method for full-sequence programming in accordance with one embodiment.

FIG. 14 is a flowchart depicting a programming process in accordance with one embodiment for full-sequence programming as shown in FIG. 9, for example. FIG. 14 will be described with respect to FIG. 5, however, it will be appreciated that other implementations can be used. At step 602, a data load or input command is received from the host and placed in the state machine. At step 604, address data is received from the host and stored in the state machine in order to select the page to be used for the write operation. At step 606, the data to be written is received and stored in DS1. At step 608, a write or program command is received from the host and placed in the state machine. At step 610, the input data from DS1 is copied to DS2 and DS4. In this embodiment, only a single bit of data is needed for DS2 and DS4 even though each cell stores two bits of data for one logical page. DS2 and DS4 are each set to 0 for cells to be programmed to states 10, 00, or 01. DS2 and DS4 are each set to 1 for cells to remain in the erased state 11. It will be appreciated that different register configurations can be used.

At step 612, the program voltage Vpgm is initialized to its starting value (e.g., 12V), and the program counter PC is initialized to its starting value (e.g., 0). The bit line voltages are set for reach memory cell at step 614. If DS4 and DS2 are both set to 0, the memory cell has yet to reach either the Vver2 or Vver1 level for its intended state and the bit line voltage is set to 0V. If DS4 is set to 0 and DS2 is set to 1, the bit line voltage is set to V1 to enable fine programming in a course/fine programming scheme. If DS4 is set to 1 and DS2 is set to 0, it indicates a memory cell that was previously verified but is now not. The bit line voltage is set to V2 to enable even slower or more reduced programming than for fine programming. If DS4 and DS2 are both set to 1, the bit line voltage is set to Vdd to inhibit programming. In one embodiment, coarse/fine programming is not used. Verification can be done only at the final verify level Vver1. In such a case, the bit lines will either be set to 0V to enable full programming, Vdd to inhibit programming, or V2 to gently program a previously verified cell that has fallen below the verify level.

At step 616, the program voltage pulse is applied to the selected word line. At step 618, verification for state 10 is performed using the Vver2 level (Vva1). Step 618 is only performed for those cells to be programmed to state 10. If the cell passes the Vver2 level verification, DS2 is set to 1. If the cell does not pass, DS2 is set or maintained at 0. At step 620, verification for state 10 is performed using the Vver1 level (Vva). If the cell passes, DS4 is set or maintained at 1. If it fails and DS4 was equal to 0 prior to beginning the current iteration n (i.e., at the end of the n−1 iteration), DS4 is maintained at 0. If however, the cell fails and DS4 was equal to 1 prior to beginning the current iteration n, DS4 is maintained at 1 and DS2 is set to 0. This combination represents a memory cell that was previously verified, but has subsequently fallen out of verification. The combination will cause the bit line of the memory cell to be pulled down to V2 during the next iteration for gradual programming back to the Vver1 verify level. As previously mentioned, other embodiments could provide an even finer level of granularity. For example, if the cell slipped below the Vver2 as well as the Vver1 verify level, a combination could be used to cause the bit line to be pulled to V1 or another value for increased programming speed above that which results from application of V2.

At step 622, verification for state 00 is performed using the Vver2 level (Vvb1). Step 622 is only performed for those cells to be programmed to state 00. If the cell passes the Vver2 level verification, DS2 is set to 1. If the cell does not pass, DS2 is set or maintained at 0. At step 624, verification for state 00 is performed using the Vver1 level (Vvb). If the cell passes, DS4 is set or maintained at 1. If it fails and DS4 was equal to 0 prior to beginning the current iteration n, DS4 is maintained at 0. If, however, the cell fails and DS4 was equal to 1 prior to beginning the current iteration, DS4 is maintained at 1 and DS2 is set to 0.

At step 626, verification for state 01 is performed using the Vver2 level (Vvc1). Step 626 is only performed for those cells to be programmed to state 01. If the cell passes the Vver2 level verification, DS2 is set to 1. If the cell does not pass, DS2 is set or maintained at 0. At step, 628, verification for state 00 is performed using the Vver1 level (Vvc). If the cell passes, DS4 is set or maintained at 1. If the cell fails and DS4 was equal to 0 prior to beginning the current iteration n, DS4 is maintained at 0. If, however, the cell fails and DS4 was equal to 1 prior to beginning the current iteration n, DS4 is maintained at 1 and DS2 is set to 0.

At step 630, it is determined if all cells for the page being programmed have their DS2 register and DS4 register storing a '1.' If so, then a status of pass is reported for the programming process at step 632. In one embodiment, a status of pass is reported if a predetermined number of memory cells have their DS2 and DS4 registers storing a '1.' If all the memory cells (or the predetermined number of memory cells) are not storing a '1' in DS2 and DS4, it is determined if the program counter is below the maximum value. If not, indicating the program process has completed its final iteration, it is determined if the number of memory cells that have failed to reach their Vver1 target level is at or below a predetermined number. If so, a status of pass is reported at step 632. If program counter PC has not reached the maximum value, the program voltage is increased by the step size and the counter incremented at step 636. After increasing the program voltage, the process returns to step 614 to set the appropriate bit line conditions. Those cells that previously verified but failed verification during the described iteration n have their bit lines set to V2 to enable a small, gradual increase in the cells' threshold voltage. Those cells that did not previously verify but reached the Vver2 level have their bit lines set to V1 to enable fine programming. Those cells that passed verification at the Vver1 level have their bit lines set to Vdd to inhibit programming during the next iteration.

It is important to note that locking out or inhibiting the cells from programming is only temporary as compared with prior art permanent lock-out methods. Verification is performed on cells that have already been successfully verified and those cells may later undergo further programming. In order to accomplish this, a copy of the original data loaded for programming is maintained throughout the program process by DS1.

Figure 15:
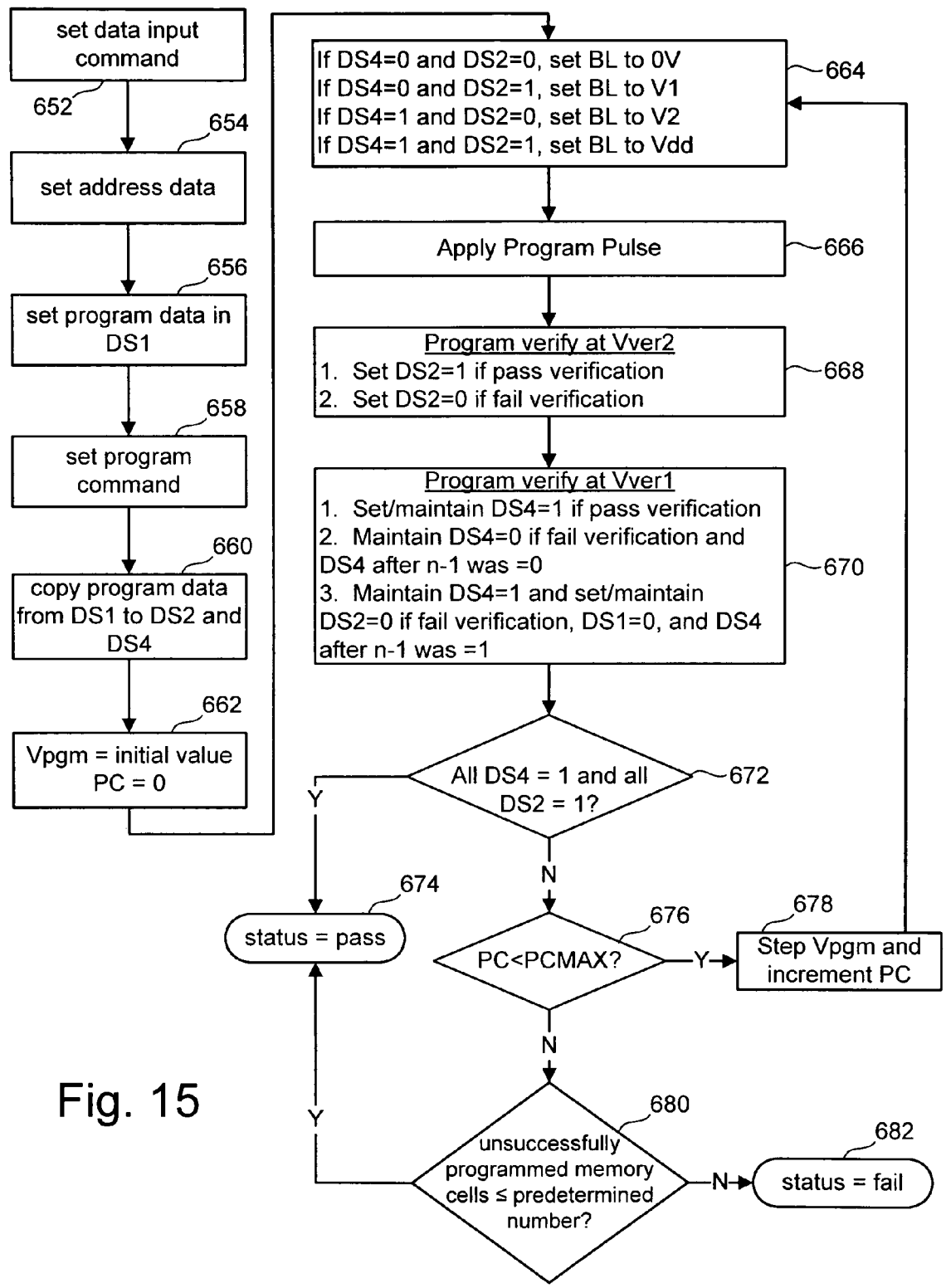
FIG. 15 is a flowchart describing a method for programming a lower page in accordance with one embodiment utilizing upper/lower page programming.

FIG. 15 is a flowchart depicting a programming process in accordance with one embodiment for programming a lower page of data when an upper/lower page scheme as depicted in FIG. 10 is used. Again, the incorporation of coarse/fine programming is optional. FIG. 15 can also be used in a binary program process. At step 652, a data input command is received from the host and placed in the state machine. At step 654, address data is received from the host and stored in the state machine in order to select the page to be used for the write operation. At step 656, the data to be written is received and stored in DS1. At step 658, a write or program command is received from the host and placed in the state machine. At step 660, the input data from DS1 is copied to DS2 and DS4. At step 662, the program voltage is initialized to its starting value (e.g., 12V), and the program counter PC initialized to its starting value (e.g., 0). The bit line voltages are set for each memory cell at step 664. If DS4 and DS2 are both set to 0, the memory cell has yet to reach either the Vver2 or Vver1 level for its intended state and the bit line voltage is set to 0V. If DS4 is set to 0 and DS2 is set to 1, the bit line voltage is set to V1 to enable fine programming is a course/fine programming scheme. If DS4 is set to 1 and DS2 is set to 0, it indicates a memory cell that was previously verified but that failed after the last verification. The bit line voltage is set to V2 to enable even slower programming than for fine programming. If DS4 and DS2 are both set to 1, the bit line voltage is set to Vdd to inhibit programming.

At step 666, the program voltage pulse is applied to the selected word line. At step 668, verification is performed using the state 10 Vver2 level (Vva1). If the cell passes the Vver2 level verification, DS2 is set to 1. If the cell does not pass, DS2 is set or maintained at 0. At step 670, verification is performed using the state 10 Vver1 level (Vva). If the cell passes, DS4 is set or maintained at 1. If it fails and DS4 was equal to 0 prior to beginning the current iteration n, DS4 is maintained at 0. If, however, the cell fails, DS4 was equal to 1 prior to beginning the current iteration n, and DS1=0, DS4 is maintained at 1 and DS2 is set to 0. The combination will cause the bit line of the memory cell to be pulled down to V2 during the next iteration for gradual programming back to the Vver1 verify level.

At step 672, it is determined if all cells for the page being programmed have their DS2 register and DS4 register storing a '1.' If so, then a status of pass is reported for the programming process at step 674. In one embodiment, a status of pass is reported if a predetermined number of memory cells have their DS2 and DS4 registers storing a '1.' If all the memory cells (or the predetermined number of memory cells) are not storing a '1' in DS2 and DS4, it is determined if the program counter is below the maximum value. If not, indicating the program process has completed its final iteration, it is determined if the number of memory cells that have failed to reach their Vver1 target level is at or below a predetermined number. If so, a status of pass is reported at step 674. If the number has not reached the predetermined number, a status of fail is reported at step 682. If program counter PC has not reached the maximum value, the program voltage is increased by the step size and the counter incremented at step 678. After increasing the program voltage, the process returns to step 664 to set the appropriate bit line conditions for the next iteration.

FIG. 16 is a flowchart depicting a programming process in accordance with one embodiment for programming an upper page when an upper/lower page scheme as depicted in FIG. 10 is used. At step 702, a data input command is received from the host and placed in the state machine. At step 704, address data is received from the host and stored in the state machine in order to select the page to be used for the write operation. At step 706, the data to be written is received and stored in DS1. At step 708, a write or program command is received from the host and placed in the state machine. At step 710, the input data from DS1 is copied to DS2 and DS4. At step 712, a read operation is performed to determine the value of the lower page bit for each memory cell. The read operation is performed using the Vra read level. If the cell conducts, indicating the cell is currently in state 11, DS3 is set to 0. If the cell does not conduct, indicating the cell is currently in state 10, DS3 is set to 1.

At step 714, the program voltage is initialized to its starting value and the program counter initialized to its starting value. The bit line voltages are set for each memory cell at step 716. If DS4 and DS2 are both set to 0, the bit line voltage is set to 0V. If DS4 is set to 0 and DS2 is set to 1, the bit line voltage is set to V1. If DS4 is set to 1 and DS2 is set to 0, the bit line voltage is set to V2. If DS4 and DS2 are both set to 1, the bit line voltage is set to Vdd to inhibit programming.

At step 718, the first programming pulse is applied. At step 720, a program verify operation for state 00 is performed using the Vver2 verify level (Vvb1). If DS3=1 and the cell passes verification, DS2 is set or maintained at 1. If DS3=1 and the cell fails verification, DS2 is set or maintained at 0. At step 722, a program verify operation for state 00 is performed using the Vver1 verify level (Vvb). If DS3=1 and the cell passes verification, DS4 is set or maintained at 1. If DS3=1, DS4 was set to 0 after the previous iteration, and the cell fails verification, DS4 is maintained at 0. If, however, the cell fails verification, DS3=1, DS4 was set to 1 after the last iteration, and DS1=0, DS4 is maintained at 1 and DS2 is set or maintained at 0.

At step 724, a program verify operation for state 01 is performed at the Vver2 verify level (Vvc1). If the cell passes and DS3=0, DS2 is set or maintained at 0. If the cell fails and DS3=0, DS2 is set or maintained at 1. At step 726, a program verify operation for state 01 is performed at the Vver1 verify level (Vvc). If the cell passes and DS3=0, DS4 is set or maintained at 1. If the cells fails, DS3=0, and DS4 was set to 0 after the last iteration, DS4 maintains a 0. If the cells fails, DS3=0, DS1=0, and DS4 was set to 1 after the last iteration, DS4 maintains a 1 and DS2 is set or maintained at 0 at 726.

At step 728, it is determined if all cells for the page being programmed have their DS2 register and DS4 register storing a '1.' If so, then a status of pass is reported for the programming process at step 730. In one embodiment, a status of pass is reported if a predetermined number of memory cells have their DS2 and DS4 registers storing a '1.'

If all the memory cells (or the predetermined number of memory cells) are not storing a '1' in DS2 and DS4, it is determined if the program counter is below the maximum value. If not, indicating the program process has completed its final iteration, it is determined at step 734 if the number of memory cells that have failed to reach their Vver1 target level is at or below a predetermined number. If so, a status of pass is reported at step 730. If the number has not reached the predetermined number, a status of fail is reported at step 736. If program counter PC has not reached the maximum value, the program voltage is increased by the step size and the counter incremented at step 738. After increasing the program voltage, the process returns to step 716 to set the appropriate bit line conditions for the next iteration.

In the embodiments discussed thus far, a memory cell that was previously verified for its target state but which later was determined to have fallen below its final verify level is subjected to immediate additional programming during application of the incremental program voltage signal. This is accomplished by changing the bit line voltage of the memory cell to enable further programming during the next iteration of the program process. In one embodiment, the memory cells are not subjected to immediate additional programming. In one embodiment, for example, gentle program pulses are applied at the end of the page programming sequence to gently program the memory cell back above the appropriate verify level. This can be accomplished by resetting the program voltage signal to its initial value and applying it again. In one embodiment, the program voltage signal is reset to a value below the initial value used when starting the normal page programming sequence. In another embodiment, the gentle program pulses are applied at the end of the programming sequence in a similar fashion to that already discussed. The memory cells do not undergo immediate re-programming but wait until the sequence is over. The program voltage signal is not reset but keeps incrementing as described. The bit line voltage for the cells can be set to a moderately high value at the end of the sequence and the memory cells gently programmed using the ongoing program voltage signal.

In one embodiment of programming a group of memory cells, memory cells are locked-out when they are verified as having reached their target threshold voltage level. The locked-out cells do not undergo further verification while programming continues for the memory cells that have not yet reached their target threshold voltage levels. When all or a predetermined number of memory cells have reached their target threshold voltage levels, a verification is again performed for all the memory cells. If any cells have fallen below their target threshold voltage levels, they can undergo further programming at that time. The program voltage could be reset (to its starting value or a lower starting value to avoid over-programming) to gently program these cells back to their target threshold voltage levels. Alternatively, the program voltage could continue to increase and a voltage applied to the bit lines of the cells undergoing further programming to avoid over-programming them.

The above examples are provided with respect to NAND type flash memory. However, the principles of the present disclosure have application to other types of non-volatile memories, including those currently existing and those contemplated to use new technology being developed. In one embodiment, the techniques described herein are used with NOR type memory. In NOR memory, the channel region is not boosted during programming so an even higher potential may exist between the control gate and floating gate during programming operations. A typical NOR flash memory is programmed with hot electron injection. A high drain and gate voltage is applied. The gate voltage is stepped up as previously described for NAND type memory. After detecting a NOR memory cell that was previously verified but then subsequently fell below its final verify level, a slightly lower drain voltage can be applied while keeping the same program voltage applied to the gate. The lowered drain voltage can allow the cell to be gently programmed back above the verify level. In another embodiment, the program voltage signal is reset at or below the initial value used and applied at the end of the page programming sequence.

The present disclosure may also be applied to devices that utilize dielectric charge storage regions as previously described. In these devices, electrons can be inadvertently drawn out of the dielectric charge storage region in a similar manner to the way electrons are drawn out of a conductive floating gate. For example, the described verification and programming techniques can be used with NROM cells that have a dielectric layer for storing charge instead of a floating gate. U.S. Pat. Nos. 5,768,192 and 6,011,725, incorporated by reference herein in their entirety, disclose such nonvolatile memory cells having a trapping dielectric layer sandwiched between two silicon dioxide layers.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile memory, comprising:
   programming a set of non-volatile storage elements, wherein each non-volatile storage element of said set is intended for programming to one of one or more target states;
   inhibiting programming of each non-volatile storage element that reaches a respective verify level corresponding to said target state to which it is intended to be programmed;
   enabling a first rate of programming of each non-volatile storage element that reaches a respective verify level corresponding to said target state to which it is intended to be programmed and that subsequently falls below said respective verify level corresponding to said target state to which it is intended to be programmed; and
   enabling a second rate of programming of each non-volatile storage element that has not yet reached a respective verify level corresponding to said target state to which it is intended to be programmed.

2. The method of claim 1, wherein:
   inhibiting programming includes applying a program inhibit voltage to a bit line of each non-volatile storage element that reaches said respective verify level corresponding to said target state to which it is intended to be programmed;
   enabling a first rate of programming includes applying a first program enable voltage to a bit line of each non-volatile storage element that reaches said respective verify level corresponding to said target state to which it is intended to be programmed and that subsequently falls below said respective verify level corresponding to said target state to which it is intended to be programmed; and enabling a second rate of programming includes applying a second program enable voltage to a bit line of each non-volatile storage element that has not yet reached said respective verify level corresponding to said target state to which it is intended to be programmed, said second program enable voltage is lower than said first program enable voltage.

3. The method of claim 1, further comprising:
verifying that said programming is successful when a predetermined number of non-volatile storage elements of said set each reach said respective verify level corresponding to said target state to which it is intended to be programmed.

4. The method of claim 1, wherein:
said one or more target states includes at least a first target state and a second target state, a first verify level corresponds to said first target state and a second verify level corresponds to said second target state; and
said inhibiting includes inhibiting programming of each non-volatile storage element intended to be programmed to said first target state that reaches said first verify level and inhibiting programming of each non-volatile storage element intended to be programmed to said second state that reaches said second verify level.

5. The method of claim 1, wherein:
said enabling a first rate of programming is performed after completing programming of every non-volatile storage element of said set except for said each non-volatile storage element that reaches said respective verify level corresponding to said target state to which it is intended to be programmed and that subsequently falls below said respective verify level corresponding to said target state to which it is intended to be programmed.

6. The method of claim 1, wherein said enabling a first rate of programming comprises:
determining at a first time that a subset of non-volatile storage elements each have a threshold voltage at or above a target threshold voltage level corresponding to said target state to which it is intended to be programmed;
determining at a later time that one or more non-volatile storage elements of said subset each have a threshold voltage below said target threshold voltage level corresponding to said target state to which it is intended to be programmed;
enabling said first rate of programming of said one or more non-volatile storage elements.

7. The method of claim 1, wherein:
programming said set of non-volatile storage elements comprises programming a first page of data.

8. The method of claim 1, wherein:
programming said set of non-volatile storage elements comprises programming a first page of data and a second page of data.

9. The method of claim 1, wherein:
non-volatile storage elements of said set are coupled to consecutive bit lines.

10. The method of claim 1, wherein:
non-volatile storage elements of said set are coupled to every other bit line of a group of bit lines.

11. The method of claim 1, wherein:
non-volatile storage elements of said set are flash memory devices.

12. The method of claim 1, wherein:
non-volatile storage elements of said set are NAND flash memory devices.

13. The method of claim 1, wherein:
non-volatile storage elements of said set are multi-state flash memory devices.

14. The method of claim 1, wherein:
said non-volatile storage elements of said set are NOR flash memory devices.

15. The method of claim 1, wherein:
inhibiting programming of each non-volatile storage element that reaches a respective verify level comprises inhibiting programming of each non-volatile storage element determined to have a threshold voltage at or above a respective verify threshold voltage level corresponding to said target state to which it is intended to be programmed.

16. The method of claim 1, wherein:
said one or more target states includes an erased state; and
said programming includes inhibiting programming of each non-volatile storage element intended for programming to said erased state.

17. The method of claim 5, wherein:
completing programming includes determining that a predetermined number of said every non-volatile storage element of said set except for said each non-volatile storage element have each reached said respective verify level corresponding to said target state to which it is intended to be programmed.

18. The method of claim 6, wherein
said programming a set of non-volatile storage elements includes applying a series of program voltage pulses;
said determining at a later time includes determining after applying a first voltage pulse of said series; and
said enabling said first rate of programming includes enabling said first rate of programming of said one or more non-volatile storage elements for a next voltage pulse immediately following said first voltage pulse, said next voltage pulse is larger than said first voltage pulse.

19. A method of programming non-volatile memory, comprising:
programming a set of non-volatile storage elements, wherein each non-volatile storage element is intended for programming to one of one or more target states;
applying a first voltage to a bit line of each non-volatile storage element that reaches a respective verify level corresponding to said target state to which it is intended to be programmed;
applying a second voltage to a bit line of each non-volatile storage element that reaches a respective verify level corresponding to said target state to which it is intended to be programmed and that is subsequently determined to no longer be at or above said respective verify level; and
applying a third voltage to a bit line of each non-volatile storage element that has not yet reached a respective verify level corresponding to said target state to which it is intended to be programmed.

20. The method of claim 19, wherein:
said applying said second voltage is performed after completing programming of every non-volatile storage element except for said each non-volatile that reaches said respective verify level corresponding to said target state to which it is intended to be programmed and that is subsequently determined to no longer be at or above said respective verify level.

21. The method of claim 19, wherein:
applying said first voltage inhibits programming of said each non-volatile storage element that is determined to have reached said respective verify level corresponding to said target state to which it is intended to be programmed;
applying said second voltage enables programming of said each non-volatile storage element that reaches said respective verify level corresponding to said target state to which it is intended to be programmed and that is subsequently determined to no longer be at or above said respective verify level; and
applying said third voltage enables programming of said each non-volatile storage element that has not yet reached said respective verify level corresponding to said target state to which it is intended to be programmed.

22. The method of claim 19, wherein:
said second voltage is greater than said third voltage;
said applying said second voltage enables programming at a first rate for said each non-volatile storage element that reaches said respective verify level corresponding to said target state to which it is intended to be programmed and that is subsequently determined to no longer be at or above said respective verify level; and
said applying said third voltage enables programming at a second rate for each non-volatile storage element that has not yet reached said respective verify level corresponding to said target state to which it is intended to be programmed, said first rate is slower than said second rate.

23. The method of claim 19, wherein:
said first voltage is a program inhibit voltage;
said second voltage is a reduced program enable voltage;
said third voltage is a program enable voltage, said third voltage is lower than said second voltage.

24. The method of claim 19, wherein:
programming said set of non-volatile storage elements comprises programming a first page of data.

25. The method of claim 19, wherein:
non-volatile storage elements of said set are coupled to consecutive bit lines.

26. The method of claim 19, wherein:
non-volatile storage elements of said set are NAND multi-state flash memory devices.

27. A method of programming non-volatile memory, comprising:
performing one or more programming operations on a first non-volatile storage element in communication with a first word line;
determining that said first non-volatile storage element has reached a verify voltage;
inhibiting further programming of said first non-volatile storage element in response to said determining;
performing one or more programming operations on a second non-volatile storage element in communication with said first word line subsequent to said inhibiting;
determining that said first non-volatile storage element is no longer at said verify voltage after performing said one or more programming operations on said second non-volatile storage element; and
performing one or more additional programming operations on said first non-volatile storage element in response to said determining that said first non-volatile storage element is no longer at said verify voltage.

28. The method of claim 27, wherein:
said performing said one or more additional programming operations includes applying a voltage to a bit line of said first non-volatile storage element such that said one or more additional programming operations programs said first non-volatile storage element slower than said one or more programming operations programs said first non-volatile storage element.

29. The method of claim 27, wherein:
said one or more programming operations performed on said first non-volatile storage element, said one or more programming operations performed on said second non-volatile storage element, and said one or more additional programming operations performed on said first non-volatile storage element are all part of a single programming process to program a page of data; and
said page of data is stored in a data store for said non-volatile memory throughout said single programming process to program said page of data.

30. The method of claim 27, wherein:
performing one or more programming operations on said first non-volatile storage element includes programming a single page of data for said first non-volatile storage element.

31. The method of claim 27, wherein:
performing one or more programming operations on said first non-volatile storage element includes performing said one or more programming operations on said second non-volatile storage element.

32. The method of claim 27, wherein:
said first and second non-volatile storage elements are NOR multi-state flash memory devices.

33. A method of programming non-volatile memory, comprising:
performing programming operations on a set of non-volatile storage elements by applying a program voltage to said set of non-volatile storage elements for each programming operation, wherein said program voltage is increased by a first step size for each subsequent programming operation;
determining that a first non-volatile storage element has reached a verify level;
inhibiting programming of said non-volatile storage element in response to said determining;
performing additional programming operations on said set of non-volatile storage elements by continuing to apply said program voltage to said set of non-volatile storage elements for each additional programming operation, wherein said program voltage continues to increase by said step size for each subsequent programming operation of said additional programming operations;
determining that said first non-volatile storage element is no longer at said verify level after performing said additional programming operations;
enabling reduced programming of said first non-volatile storage element in response to said determining that said first non-volatile storage element is no longer at said verify level; and
performing further programming operations on said set of non-volatile storage elements after said enabling by continuing to apply said program voltage to said set of non-volatile storage elements for each further programming operation, wherein said program voltage continues to increase by said step size for each subsequent programming operation of said further programming operations.

34. The method of claim 33, wherein:

enabling reduced programming of said first non-volatile storage element comprises applying a first voltage to a bit line of said first non-volatile storage element such that said further programming operations program said first non-volatile storage element slower than said programming operations.

35. The method of claim 33, wherein:

a last pulse of said program voltage applied to said set before determining that said first non-volatile has reached said verify level has a first value;

a first pulse of said program voltage applied for said further programming operations that has a second value;

said second value of said program voltage is at least two step sizes larger than said first value.

36. The method of claim 33, wherein:

non-volatile storage elements of said set are coupled to every other bit line of a group of bit lines.

37. The method of claim 33, wherein:

non-volatile storage elements of said set are binary flash memory devices.

* * * * *